(12) United States Patent
Back

(10) Patent No.: US 6,168,959 B1
(45) Date of Patent: Jan. 2, 2001

(54) METHOD OF FORMING A FERROELECTRIC MEMORY DEVICE

(75) Inventor: Yong Ku Back, Seoul (KR)

(73) Assignee: Hyundai Electronics Industries Co., Ltd., Kyungki-do (KR)

( * ) Notice: Under 35 U.S.C. 154(b), the term of this patent shall be extended for 0 days.

(21) Appl. No.: 09/468,935

(22) Filed: Dec. 22, 1999

(30) Foreign Application Priority Data

Dec. 30, 1998 (KR) .................................................. 98-61405

(51) Int. Cl.⁷ .................................................... H01L 21/00
(52) U.S. Cl. ................................................ 438/3; 438/800
(58) Field of Search ........................ 438/3, 800; 257/295; 365/65, 109, 117, 145; 377/101

(56) References Cited

U.S. PATENT DOCUMENTS

| 5,235,199 |   | 8/1993  | Hamamoto et al. .        |
|-----------|---|---------|--------------------------|
| 5,426,304 |   | 6/1995  | Belcher et al. .         |
| 5,436,450 |   | 7/1995  | Belcher et al. .         |
| 5,561,311 |   | 10/1996 | Hamamoto et al. .        |
| 5,744,832 | * | 4/1998  | Wolters et al. ... 257/295 |
| 5,959,878 | * | 9/1999  | Kamp ................ 365/117 |

FOREIGN PATENT DOCUMENTS

| 7-58296  | 3/1995  | (JP) . |
| 8-195079 | 7/1996  | (JP) . |
| 9-293396 | 11/1997 | (JP) . |

* cited by examiner

*Primary Examiner*—Charles Bowers
*Assistant Examiner*—Craig Thompson
(74) *Attorney, Agent, or Firm*—Pennie & Edmonds LLP

(57) ABSTRACT

There is disclosed a method of manufacturing a ferroelectric memory device capable of improving the problems in a conventional plugging or strapping method, which are used in connecting a ferroelectric capacitor and a transistor. The present invention forms a contact leading pad at the drain junction of the transistor in the process of forming bit lines, and then forms and connects a ferroelectric capacitor and a local interconnection line connects. In this manner, the present invention connects the ferroelectric capacitor and the transistor through an additional contact leading using a local interconnection method without directly connecting them. Thus, the method according to the present invention can reduce the cell area per unit since the capacitor can be positioned at the same position to the transistor. Also, it can improve the characteristic of a device, since it can use metals suitable for interconnection materials but not used due to low step coverage.

3 Claims, 2 Drawing Sheets

METHOD OF FORMING A FERROELECTRIC MEMORY DEVICE

BACKGROUND OF THE INVENTION

1. Field of the Invention

The present invention relates to a method of forming a ferroelectric memory. In particular, the present invention relates to a method of forming a ferroelectric memory having improved method of connecting ferroelectric capacitors storing information and transistors controlling input/output of the information.

2. Description of the Prior Art

As a method of connecting capacitors and transistors in manufacturing a ferroelectric Random Access Memory (FeRAM), there is known a method of making storage node in the plugging way. This method, however, actually experiences many technical difficulties in manufacturing the ferroelectric memory device.

As another example, there is known a strapping method. Though this method is suitable for interconnection materials since it can make the depth of contact hole deeper. However, this method has also difficulties not capable of using metals having a low step coverage characteristic, and also in manufacturing a ferroelectric memory device having a desired electric characteristic since it requires only a good step coverage characteristic regardless of whether or not it is suitable as interconnection materials. Further, using this method, since the contact hole for interconnection is defined at the junction region of the transistor, it is difficult to obtain a sufficient capacity since the area enough to form the capacitor at the same position to the transistor is not secured. Thus, it has a difficulty in reducing the cell area per unit because it must form the capacitor at the field region portion.

In FIG. 1, there is shown a sectional view of a device for illustrating a conventional method of manufacturing a ferroelectric memory device.

Now, the method of manufacturing a conventional method of manufacturing a ferroelectric memory device will be below explained in detail by reference to FIG. 1.

First, an underlying structure of a transistor consisting of a word line 13, a junction region 14 etc., is formed on an active region of a semiconductor substrate 11 in which a device separation film 12 is formed. Next, a first interlayer insulating film 15 is formed on the entire structure. Then, the first interlayer insulating layer 15 is etched to expose the junction region 14, thus forming a contact hole for bit line to form a bit line 16. Thereafter, materials for a lower electrode, a ferroelectric material and materials for an upper electrode are sequentially formed on the entire structure. Next, they are patterned to form a capacitor 17 consisting of a lower electrode 17A, a ferroelectric film 17B and an upper electrode 17C on the device separation region.

Next, a second interlayer insulating film 18 is formed on the entire structure and a contact hole is formed to expose the upper electrode 17C of the capacitor 17. Thereafter, the second interlayer insulating film 18 and the first interlayer insulating film 15 are sequentially etched to expose the junction region 14. Then, after a metal layer is formed on it, it is patterned to form a local interconnection line that connects the junction region 14 and the upper electrode 17C of the capacitor 17.

However, if this method is used in manufacturing a ferroelectric memory device, a deep contact hole is formed, as a result of etching the second interlayer insulating film 18 and the first interlayer insulating film 15 so that the junction region 14 and the upper electrode 17C of the capacitor 17 can be connected. Thus, it is extremely difficult to use a sputtering method by which the junction region 14 of the transistor and the upper electrode 17C of the capacitor 17 are connected through this deep contact hole.

In addition, as it is difficult to form the transistor and the capacitor at the same position, there is limitation in reducing the cell area per unit.

SUMMARY OF THE INVENTION

It is an object of the present invention to solve the problems involved in the prior art, and to provide a method of manufacturing a ferroelectric memory device, which is capable of reducing the cell area per unit since the capacitor thereof can be positioned at the same position to the transistor and also of improving the device characteristic since it can use a metal suitable for interconnection materials but not used due to low step coverage.

In order to achieve the above object, the method of manufacturing a ferroelectric memory device according to the present invention comprises the steps of providing a semiconductor substrate in which a device separation film and a transistor are formed; forming a first interlayer insulating film on the entire structure and then forming a contact hole for bit lines and a contact hole for contact leading pad; forming and patterning a first conductive layer on the entire structure to form a bit line and a contact leading pad, respectively; forming a second interlayer insulating film on the entire structure including said bit line and said contact leading pad, sequentially forming materials for a lower electrode, ferroelectric materials and materials for upper electrode on the entire structure and then patterning it to form a capacitor consisting of the upper electrode, the ferroelectric film and the upper electrode; forming a third interlayer insulating film on the entire structure, and then etching a portion of said third interlayer insulating film on said capacitor and some portion of said third and second interlayer insulating films on said contact leading pad to form a contact hole for connecting the capacitor through which said upper electrode of said capacitor and the upper portion of said contact leading pad can be exposed; and forming a second conductive layer on the entire structure so that said contact hole for connecting said capacitor can be entirely buried, and then patterning it to forming a local interconnection line.

BRIEF DESCRIPTION OF THE DRAWINGS

The above object, and other features and advantages of the present invention will become more apparent by describing the preferred embodiment thereof with reference to the accompanying drawings, in which.

DETAILED DESCRIPTION OF PREFERRED EMBODIMENT

A preferred embodiment of the present invention will be below explained in detail by reference to the accompanying drawings.

FIGS. 2a through 2e show sectional views of a device illustrating a method of manufacturing a ferroelectric memory device according to the present invention.

Figure 1:
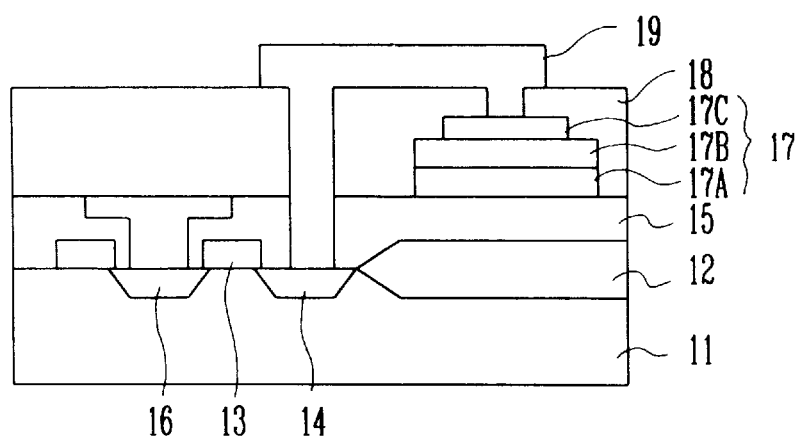
FIG. 1 shows a sectional view of a device illustrating a conventional method of manufacturing a ferroelectric memory device.
Figure 2A:
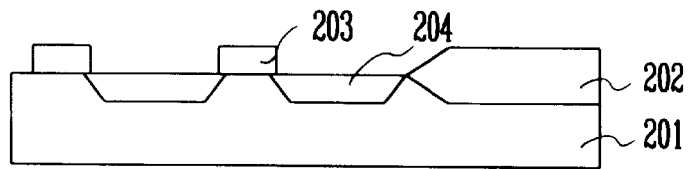
FIGS. 2a through 2e show sectional views of a device illustrating a method of manufacturing a ferroelectric memory device according to the present invention.

As shown in FIG. 2a, a underlying structure of a transistor etc. consisting of a word line 203, a junction region 204 etc. is formed on a semiconductor substrate 201 in which a device separation film 202 is formed.

Figure 2B:
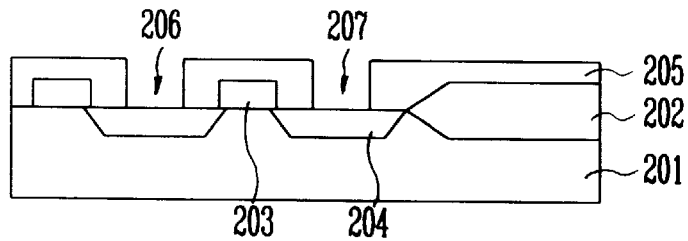

Next, as shown in FIG. 2b, a first interlayer insulating film 205 is formed on the entire structure. Then, the first interlayer insulating layer 205 is patterned to form a contact hole for bit line 206 and a contact hole for a contact leading pad 207.

Figure 2C:
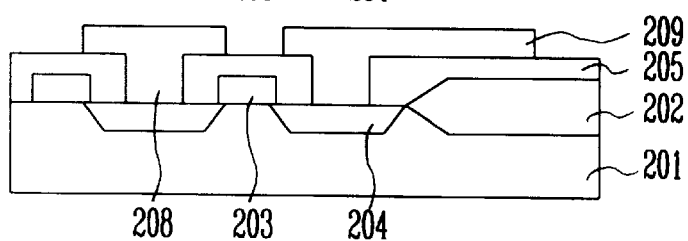

As shown in FIG. 2c, a conductive layer is formed on the entire structure. Then, it is patterned to form a bit line 208 and a contact leading pad 209, simultaneously. In the above, the bit line 208 and the contact leading pad 209 are separated to each other on a layout, and the conductive layer is formed using a stack structure of polysilicon in which phosphorous is doped for increasing the flow of electrons, tungsten silicide and titanium silicide.

Figure 2D:
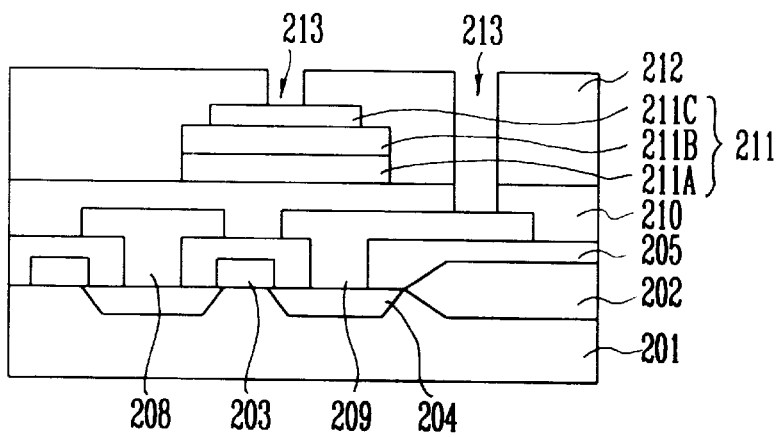

As shown in FIG. 2d, a second interlayer insulating film 210 is formed on the entire structure including the bit line 208 and the contact leading pad 209. Next, material for a lower electrode, a ferroelectric material and a material for an upper electrode are sequentially formed on the entire structure. Then, they are patterned to form a capacitor 211 consisting of a lower electrode 211A, a ferroelectric film 211B and an upper electrode 211C on the device separation region. At this time, as the capacitor 211 is connected to the contact leading pad 209 in a subsequent process, it can be formed at the same plane to the transistor formed below. Next, a third interlayer insulating film 212 is formed on the entire structure. Thereafter, the third interlayer insulating film is patterned to form a contact hole through which the upper electrode 211C of the capacitor 211 can be exposed. Next, the third interlayer insulating film 212 and the second interlayer insulating film 210 are sequentially etched to form a contact hole through which the upper of the contact leading pad can be exposed. The contact hole becomes a contact hole 213 for connecting the capacitor.

Figure 2E:
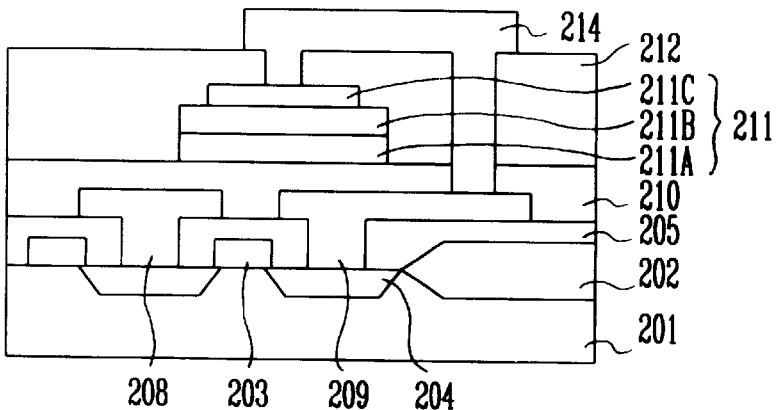

As shown in FIG. 2e, after a conductive layer is formed on the entire structure so that the contact hole 213 for connecting the capacitor can be completely buried, it is patterned to form a local interconnection line 214, thereby connecting the junction region 204 and the upper electrode 211C of the capacitor 211.

As described above, using the above-mentioned method, it can suppress a deep contact hole generating when connecting the upper electrode of the ferroelectric capacitor and the junction region of the transistor and also it can easily use interconnection materials which do not deteriorate the characteristic of a ferroelectric capacitor.

Also, since it can arrange the capacitor of a ferroelectric memory device at the same position to the transistor, it can reduce the cell area per unit. Further, since it can form simultaneously the leading contact pad upon formation of the bit line, it can obviate an additional process.

According to the present invention, since it indirectly connects the junction region of the transistor and the upper electrode of the capacitor through the contact leading pad when manufacturing a ferroelectric memory device, it does not form a deep contact hole. Thus, it can provide the advantages in that it can maintain a good interconnection characteristic even when a metal thin film having a low step coverage characteristic, and that it can reduce the cell area per unit since the capacitor can be arranged at the same position to the transistor.

While the present invention has been described and illustrated herein with reference to the preferred embodiment thereof, it will be understood by those skilled in the art that various changes in form and details may be made therein without departing from the spirit and scope of the invention.

What is claimed is:

1. A method of manufacturing a ferroelectric memory device, comprising the steps of:

providing a substrate in which a device separation film and a transistor are formed;

forming a first interlayer insulating film on the entire structure and then forming a contact hole for bit lines and a contact hole for contact leading pad;

forming and patterning a first conductive layer on the entire structure to form a bit line and a contact leading pad, respectively;

forming a second interlayer insulating film on the entire structure including said bit line and said contact leading pad, sequentially forming materials for a lower electrode, ferroelectric materials and materials for upper electrode on the entire structure and then patterning it to form a capacitor consisting of the lower electrode, the ferroelectric film and the upper electrode;

forming a third interlayer insulating film on the entire structure, and then etching a portion of said third interlayer insulating film on said capacitor and some portion of said third and second interlayer insulating films on said contact leading pad to form a contact hole for connecting the capacitor through which said upper electrode of said capacitor and the upper portion of said contact leading pad can be exposed; and forming a second conductive layer on the entire structure so that said contact hole for connecting said capacitor can be entirely buried, and then patterning it to forming a local interconnection line.

2. The method of manufacturing a ferroelectric memory device as claimed in claim 1, wherein said first conductive layer has a stack structure of polysilicon in which phosphor is doped, tungsten silicide and titanium silicide.

3. The method of manufacturing a ferroelectric memory device as claimed in claim 1, wherein said capacitor is positioned at the same position to the transistor.

* * * * *